(12) United States Patent
Kumata et al.

(10) Patent No.: US 7,999,284 B2
(45) Date of Patent: Aug. 16, 2011

(54) SEMICONDUCTOR DEVICE AND OPTICAL DEVICE MODULE HAVING THE SAME

(75) Inventors: Kiyoshi Kumata, Kyotanabe (JP); Kazuya Fujita, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 538 days.

(21) Appl. No.: 12/155,042

(22) Filed: May 29, 2008

(65) Prior Publication Data
US 2008/0296718 A1    Dec. 4, 2008

(30) Foreign Application Priority Data
May 31, 2007  (JP) ................................. 2007-146190

(51) Int. Cl.
*H01L 29/74*  (2006.01)
(52) U.S. Cl. ........ 257/127; 257/433; 257/434; 257/701; 257/684
(58) Field of Classification Search ............. 257/31.032, 257/31, 127, 431, 433, 432, 434, 701, 704, 257/680, 684, 149, 151, 291
See application file for complete search history.

(56) References Cited

U.S. PATENT DOCUMENTS

| | | |
|---|---|---|
| 2002/0105591 A1 | 8/2002 | Nakamura et al. |
| 2004/0002179 A1 | 1/2004 | Barton et al. |
| 2004/0036069 A1 | 2/2004 | Barton et al. |
| 2004/0164981 A1 | 8/2004 | Fujita et al. |
| 2005/0247992 A1 | 11/2005 | Tsukamoto et al. |
| 2006/0237829 A1 | 10/2006 | Hosomi |
| 2007/0019101 A1 | 1/2007 | Minamio et al. |
| 2007/0030334 A1 | 2/2007 | Nishizawa |
| 2007/0267712 A1 | 11/2007 | Fujita et al. |
| 2010/0244171 A1* | 9/2010 | Nagamatsu et al. .......... 257/433 |

FOREIGN PATENT DOCUMENTS

| | | |
|---|---|---|
| JP | 04-239759 | 8/1992 |
| JP | 11-103038 | 4/1999 |
| JP | 2002-231918 | 8/2002 |
| JP | 2004-31939 | 1/2004 |
| JP | 2004-146946 | 5/2004 |
| JP | 2004-296453 | 10/2004 |
| JP | 2005-20687 | 1/2005 |
| JP | 2005-322809 | 11/2005 |
| JP | 2006-310859 | 11/2006 |
| JP | 2007-53337 | 3/2007 |
| JP | 2007-115833 | 5/2007 |
| JP | 2008-011144 | 1/2008 |

OTHER PUBLICATIONS

U.S. Appl. No. 12/156,192, filed Jun. 19, 2008.
U.S. Appl. No. 12/156,192 Office Filing receipt, Jun. 19, 2008.

* cited by examiner

*Primary Examiner* — Michael B Shingleton
(74) *Attorney, Agent, or Firm* — Edwards Angell Palmer & Dodge LLP; David G. Conlin; David A. Tucker

(57) ABSTRACT

A solid-state imaging device 1 is arranged so that a hollow section 9 is formed between a solid-state imaging element 2 and a covering section 4 and an air path 7 is formed in an adhesive section 5 so as to extend from the hollow section 9 to the outside, wherein the adhesive section 5 is formed so as not to be positioned on a signal processing section 8 for processing a signal of the solid-state imaging element 2. This makes it possible to reduce noises occurring in the signal processing section of the semiconductor element while preventing occurrence of condensation in the covering section for covering the semiconductor element.

14 Claims, 7 Drawing Sheets

SEMICONDUCTOR DEVICE AND OPTICAL DEVICE MODULE HAVING THE SAME

This Nonprovisional application claims priority under 35 U.S.C. §119(a) on Patent Application No. 146190/2007 filed in Japan on May 31, 2007, the entire contents of which are hereby incorporated by reference.

FIELD OF THE INVENTION

The present invention relates to (i) a semiconductor device which reduces noises occurring in a signal processing section for processing a signal of a semiconductor element and (ii) an optical device module having the semiconductor device.

BACKGROUND OF THE INVENTION

A conventional photo acceptance semiconductor device, such as a CCD (Charge Coupled Device) image sensor and a CMOS (Complementary Metal Oxide Semiconductor) image sensor, for converting an optical signal into an electric signal has a semiconductor element or the like packaged and sealed in a hollow package made of ceramics, plastics or the like, in order to prevent moisture, contaminant and the like from entering the semiconductor element from the outside.

FIG. 6 is a sectional view schematically illustrating a structure of a solid-state imaging device as an example of a conventional photo acceptance semiconductor device. The solid-state imaging device 100 includes: a circuit substrate 101 serving as a base; a solid-state imaging element (photo acceptance element) 102; and a covering body 104 attached via an adhesive section 103 on the circuit substrate 101 so as to cover the solid-state imaging element 102. The solid-state imaging device 100 constitutes a hollow package having a hollow section in the covering body 104. The solid-state imaging element 102 is disposed in the covering body 104. In the covering body 104, a transparent covering section 105 is disposed opposite to the solid-state imaging element 102. The transparent covering section 105 is attached to the covering body 104 via an adhesive section 106. Between the transparent covering section 105 and the circuit substrate 101 (solid-state imaging element 102), a space S is formed. The circuit substrate 101 is made of ceramics, glass epoxy, or the like, and the circuit substrate 101 and the solid-state imaging element 102 are electrically connected to each other via a bonding wire 107. The covering body 104 supports a lens barrel 108 positioned at an internal center of the covering body 104, and the lens barrel 108 supports lenses 109 positioned inside the lens barrel 108.

In the solid-state imaging device 100 of FIG. 6, the covering body 104 is disposed above the circuit substrate 101 via the adhesive section 103, and the solid-state imaging element 102 is stored in the covering body 104. Thus, it is difficult to make the solid-state imaging device 100 smaller.

Patent Document 1 discloses a solid-state imaging device which can be made smaller. FIG. 7 is a sectional view of the solid-state imaging device of Patent Document 1. The solid-state imaging device 200 is arranged so that a transparent covering section 205 is bonded to a solid-state imaging element 202 via an adhesive section 203. Further, the solid-state imaging element 202 and the transparent covering section 205 are molded with a poromeric mold resin 207 so that a surface of the covering section 205 is exposed. Further, a lens barrel 208 supporting a lens 206 is bonded to the mold resin 207 via an adhesive section (not shown). In the solid-state imaging device 200, the solid-state imaging element 202 does not have to be stored in the lens barrel (covering body) 208, so that the solid-state imaging device 200 can be made smaller than the solid-state imaging device 100.

In the solid-state imaging device 200 of FIG. 7, a hollow section 209 is formed between the solid-state imaging element 202 and the transparent covering section 205. The hollow section 209 is a tightly closed space, so that condensation may occur on an internal face of the covering section 205.

Patent Document 2 discloses a solid-state imaging device having an air path as measures for preventing occurrence of condensation. FIG. 8 is a plan view (top view) illustrating a partial arrangement of the solid-state imaging device 300 of Patent Document 2. FIG. 9 is a cross sectional view taken along C-C of the solid-state imaging device 300 of FIG. 8. As illustrated in FIG. 9, the solid-stated imaging device 300 of Patent Document 2 is arranged so that a hollow section 309 is formed between a solid-state imaging element 302 and a transparent covering section 305, so that condensation may occur on the internal face of the covering section 305. Thus, as measures for preventing occurrence of condensation, an air path is formed in the adhesive section 303 via which the solid-state imaging element 302 and the transparent covering section 305 are bonded to each other.

Specifically, as illustrated in FIG. 8, the solid-state imaging device 300 is arranged so that an air path 311 extending from the hollow section 309 to the outside is formed. The adhesive section 309 occupies a larger area than the transparent covering section 305, and the air path 311 is formed in the adhesive section 303 so as to be positioned outside the covering section 305. This air path 311 allows a surface of the solid-state imaging element 302 to be under the same condition as ambient air, so that it is possible to prevent occurrence of condensation in the covering section 305. Further, the air path 311 has a complicate shape, thereby preventing water from entering the hollow section 309 via the air path 311.

However, according to the arrangement described in Patent Document 2, when converting an optical signal received by the solid-state imaging element into an electric signal, noises of unknown origin occur, and the noises result in a strip-shaped contrast difference on the screen. This was found by the present inventors.

[Patent Document 1]
Japanese Unexamined Patent Publication Tokukai 2004-296453 (Publication date: Oct. 21, 2004)
[Patent Document 2]
Japanese Unexamined Patent Publication Tokukai 2005-322809 (Publication date: Nov. 17, 2005)

SUMMARY OF THE INVENTION

The present invention was made in view of the foregoing problems, and an object of the present invention is to provide (i) a semiconductor device which reduces noises occurring in a signal processing section of a semiconductor element while preventing occurrence of condensation in a covering section for covering the semiconductor element and (ii) an optical device module having the semiconductor device.

As a result of diligent study carried out by the present inventors, they found that the adhesive section causes noises to occur in the solid-state-imaging device of Patent Document 2, thereby completing the present invention.

That is, in order to achieve the foregoing object, a semiconductor device of the present invention includes: a semiconductor element; a covering section for covering the semiconductor element; an adhesive section for bonding the semiconductor element and the covering section; and a signal processing section for processing a signal of the semiconductor element, wherein a hollow section is formed between the semiconductor element and the covering section, and an air path is formed in the adhesive section so as to extend from the hollow section to the outside, and the adhesive section is formed so as to entirely cover the signal processing section.

According to the arrangement, the air path is formed so as to extend from the hollow section to the outside, so that it is possible to prevent occurrence of condensation in the covering section.

Moreover, according to the arrangement, (the entire area of) the signal processing section is entirely covered by the adhesive section. Thus, the adhesive section does not partially influence the signal processing section. That is, the adhesive section entirely influences the signal processing of the signal processing section. Thus, it is possible to reduce noises occurring in the signal processing section.

Further, in order to achieve the foregoing object, another semiconductor device of the present invention includes: a semiconductor element; a covering section for covering the semiconductor element; an adhesive section for bonding the semiconductor element and the covering section; and a signal processing section for processing a signal of the semiconductor element, wherein a hollow section is formed between the semiconductor element and the covering section, and an air path is formed in the adhesive section so as to extend from the hollow section to the outside, and the adhesive section is formed so as not to be positioned on the signal processing section.

According to the foregoing arrangement, the air path is formed so as to extend from the hollow section to the outside, so that it is possible to prevent occurrence of condensation in the covering section. Further, the air path can occupy a larger area than that in case where (the entire area of) the signal processing section is entirely covered, so that it is possible to more effectively prevent occurrence of condensation. Further, it is possible to reduce an amount of the adhesive used.

Moreover, according to the arrangement, the adhesive section is formed so as not to be positioned on the signal processing section. That is, the entire area of the signal processing section is free from any adhesive. As a result, the adhesive section does not influence the signal processing of the signal processing section. Thus, it is possible to reduce noises occurring in the signal processing section.

In this manner, each of the semiconductor devices of the present invention can reduce noises occurring in the signal processing section while preventing occurrence of condensation in the covering section.

An optical device module of the present invention includes any one of the aforementioned semiconductor devices and a lens unit for guiding external light to the semiconductor element, wherein: the covering section is transparent, and the semiconductor element is a solid-state imaging element having an effective pixel region in which a plurality of photo acceptance elements for converting light transmitted through the covering section into an electric signal are disposed, and the adhesive section is formed so as not to be positioned on the effective pixel region.

According to the arrangement, the optical device module internally includes the solid-state imaging device which is one embodiment of the semiconductor device of the present invention, so that it is possible to realize the optical device module which can reduce noises occurring in the signal processing section of the semiconductor element (solid-state imaging element) while preventing occurrence of condensation in the covering section for covering the semiconductor element.

Additional objects, features, and strengths of the present invention will be made clear by the description below. Further, the advantages of the present invention will be evident from the following explanation in reference to the drawings.

DESCRIPTION OF THE EMBODIMENTS

The following describes an embodiment of the present invention with reference to the attached drawings. Note that, the following describes a case where the semiconductor device of the present invention is a solid-state imaging device including a solid-state imaging element as a semiconductor element.

Embodiment 1

Figure 1:
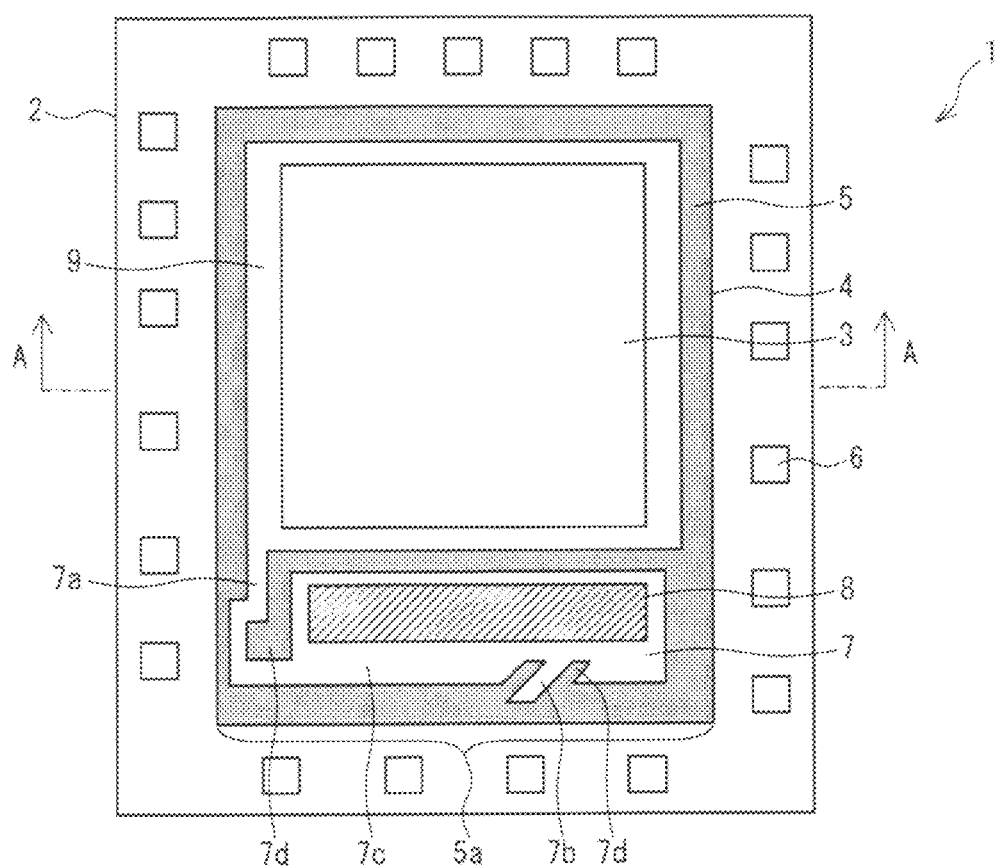
FIG. 1 is a plan view schematically illustrating an arrangement of a solid-state imaging device of the present invention.
Figure 2:
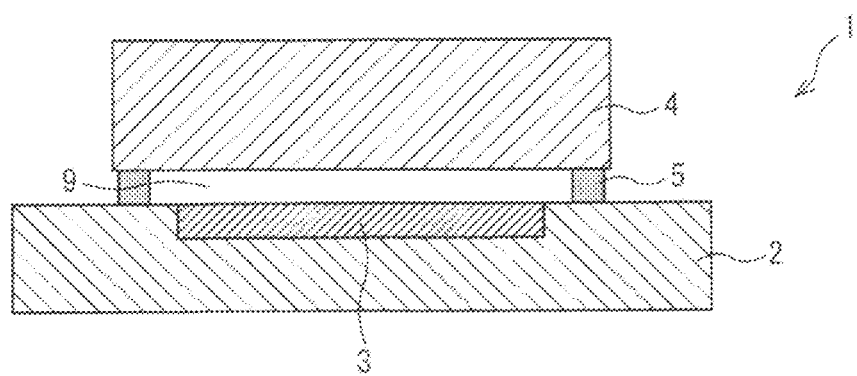
FIG. 2 is a cross sectional view taken along A-A of the solid-state imaging device of FIG. 1.

Each of FIG. 1 and FIG. 2 schematically illustrates a solid-state imaging device (semiconductor device) 1 according to Embodiment 1 of the present invention. FIG. 1 is a plan view (top view) of the solid-state imaging device 1 whose main surface (one side) is seen from the above. FIG. 2 is a cross sectional view taken along A-A of the solid-state imaging device 1 of FIG. 1.

The solid-state imaging device 1 includes, as main components, a solid-state imaging element (semiconductor element) 2, a covering section 4, an adhesive section 5 for bonding the solid-state imaging element 2 and the covering section 4, and a signal processing section 8 for processing a signal of the solid-state imaging element 2.

The solid-state imaging element 2 is a semiconductor substrate (e.g., a silicon monocrystal substrate) having a semiconductor circuit thereon and having a square shape in a plan view. Examples of the solid-state imaging element 2 include a CCD (charge-coupled device) image sensor, a CMOS (complementary metal-oxide semiconductor) image sensor, and a VMIS image sensor (Threshold Voltage Modulation Image Sensor). The solid-state imaging element 2 has an effective pixel region 3 in which a plurality of photo acceptance elements (pixels) are disposed in a matrix manner. The effective pixel region 3 is formed on a central portion of a main face (surface) of the solid-state imaging element 2 so as to have a square shape in a plan view. Further, the photo acceptance elements convert a subject image (light transmitted through the covering section 4) formed on the effective pixel region 3 into an electric signal.

The covering section 4 is made of transparent material (e.g., glass) and is disposed opposite to the solid-state imaging element 2 so as to cover at least the effective pixel region 3. Note that, the solid-state imaging element 2 (effective pixel region 3) and the covering section 4 are not in contact with each other. Further, a size of the covering section 4 is smaller than the solid-state imaging element 2. In this manner, the covering section 4 is disposed opposite to the main face of the solid-state imaging element 2 so as to cover at least the effective pixel region, so that it is possible to protect the effective pixel region 3 from the outside. That is, it is possible to protect the effective pixel region 3 from external moisture, dusts (contaminants, parings) and the like.

The adhesive section 5 is formed around the effective pixel region 3 so as to have a cyclic-square shape in a plan view so that an optical path between the effective pixel region 3 and the covering section 4 is not shielded. As illustrated in FIG. 2, the adhesive section 5 bonds the effective pixel region 3 and the covering section 4 so that the hollow section (space) 9 is formed between the effective pixel region 3 and the covering section 4. That is, the covering section 4 and the adhesive section 5 constitute a covering body which covers the solid-state imaging element 2. In the adhesive section 5, an air path 7 extending from the hollow section 9 to the outside is formed as described below.

In this manner, the adhesive section 5 is formed on a region which does not shield an optical path between the covering section 4 and the effective pixel region 3. Thus, it is possible to form the adhesive section 5 and the air path 7 without dropping photo acceptance efficiency in an optical signal.

Note that, it is preferable that the adhesive section 5 includes photosensitive adhesive such as UV cure resin for example. This makes it possible to form the adhesive section 5 whose air path 7 is highly accurately formed and highly accurately positioned in accordance with photolithography. Moreover, it is possible to form at once a large number of adhesive sections 5 highly accurately patterned.

The signal processing section 8 is a signal processing circuit section for processing a signal of the solid-state imaging element 2. Specifically, the signal processing section 8 controls operations of the solid-state imaging element 2 and functions also as a control section (image processing device) for suitably processing a signal outputted from the solid-state imaging element 2 so as to generate a necessary signal. For example, the signal processing section 8 includes electronic components such as: an amplification circuit section (analog signal circuit section) for amplifying an electric signal obtained by conversion with the photo acceptance elements of the effective pixel region 3 so as to output the electric signal as an analog signal; an analog/digital conversion processing circuit section for converting the analog signal into a digital signal; a DSP (digital signal processor) for controlling operations of the solid-state imaging element 2; a CPU for performing various kinds of operations in accordance with a program; a ROM for storing the program therein; and a RAM for storing data and the like of respective processing steps. Further, the solid-state imaging device 1 is entirely controlled by these electronic components.

In the present embodiment, the signal processing section 8 is disposed adjacent to the effective pixel region 3, the adhesive section 5 is not formed on a region where the signal processing section 8 is formed. That is, the adhesive section 5 is formed so as not to be positioned on the signal processing section 8. As a result, the signal processing section 8 is exposed from the adhesive section 5.

Note that, in the solid-state imaging device 1, a plurality of bonding pads 6 each of which serves as a terminal for connecting the solid-state imaging element 2 and an external circuit (not shown) are disposed between the adhesive section 5 (covering section 4) and a peripheral end (chip end) of the main face of the solid-state imaging element 2. The bonding pads 6 are not covered by the covering section 4. Thus, a plane size of the covering section 4 is smaller than a plane size of the solid-state imaging element 2, thereby making the solid-state imaging element 2 smaller.

The solid-state imaging device 1 incorporates external light through the covering section 4 and the photo acceptance elements disposed on the effective pixel region 3 receive light indicative of an image. In the solid-state imaging device 1, the hollow section 9 is formed between the effective pixel region 3 and the covering section 4, so that external light having been transmitted through the covering section 4 is incident on the effective pixel region 3 without any modification, so that no light loss occurs in the optical path.

In the solid-state imaging device 1, the hollow section 9 is formed between the solid-state imaging element 2 and the transparent covering section 4 as described above, so that condensation may occur on the internal face of the covering section 4. Thus, the air path 7 is formed in the adhesive section 5 for bonding the solid-state imaging element 2 and the transparent covering section 4 as means for preventing occurrence of condensation. The air path 7 is formed in the adhesive section 5 so as to extend from the hollow section 9 to the outside.

Figure 8:
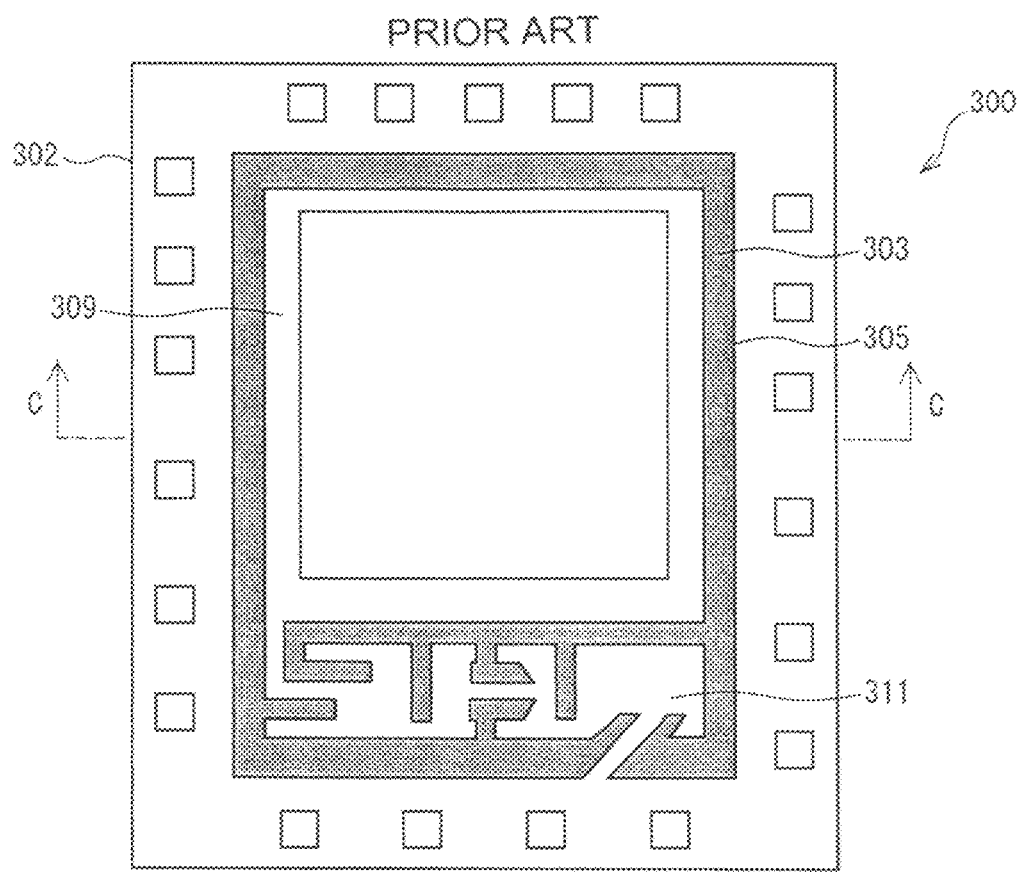
FIG. 8 is a plan view illustrating essential portions of a solid-state imaging device of Patent Document 2.
Figure 9:
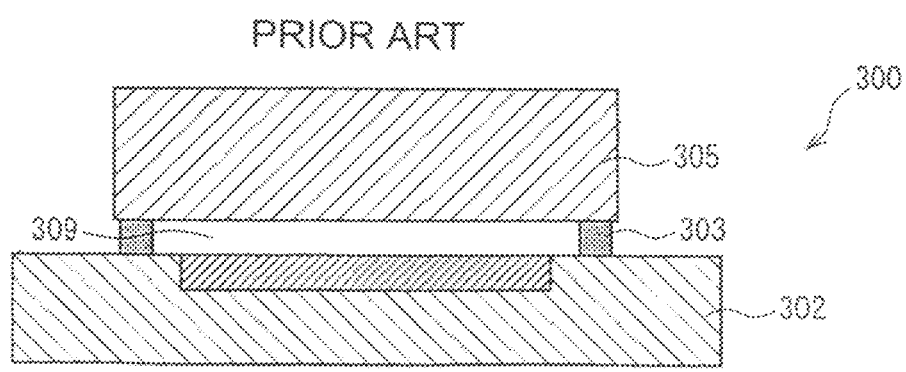
FIG. 9 is a cross sectional view taken along C-C of the solid-state imaging device of FIG. 8.

Also the solid-state imaging device 300 (see FIG. 8) of Patent Document 2 has the air path 311. However, the shape of the air path 311 is complicate in order to more effectively prevent water and foreign substance from entering the hollow section 309. Moreover, no preparation against noises is made in the solid-state imaging device 300.

The present inventors diligently studied a cause of noises occurring in the solid-state imaging device 300 of Patent Document 2. As a result, it was found that the noises are caused by a condition under which the signal processing section is partially covered by the adhesive section. That is, it was found that: the adhesive section has a portion which covers the signal processing section and a portion which does not cover the signal processing section, so that a dielectric constant of the adhesive section influences processing of the signal processing section, which results in noises on the screen.

Thus, in the solid-state imaging device 1 of the present embodiment, the adhesive section 5 is formed so as not to be positioned on the signal processing section 8. That is, the adhesive section 5 is formed so as not to entirely cover the signal processing section 8. As a result, the adhesive section 5 does not influence the signal processing of the signal processing section 8. This makes it possible to reduce noises occurring in the signal processing section 8. Therefore, it is possible to prevent a dielectric constant of the adhesive section 5 from influencing the signal processing section 8, thereby preventing occurrence of noises on the screen.

In the solid-state imaging device 1, the noises greatly influence the analog signal circuit section of the signal processing section 8, particularly, the amplification circuit section which amplifies an electric signal obtained by conversion with the photo acceptance elements. Thus, in the solid-state imaging device 1, it is preferable to form the adhesive section 5 so that the adhesive section 5 is not positioned on the analog signal circuit section, particularly, not positioned on the amplification circuit section. If the adhesive section 5 is formed so as not to be positioned on the signal processing section 8 in this manner, it is possible to reduce noises of the analog signal circuit section and the amplification circuit section each of which is likely to generate noises. Note that, the adhesive section 5 is formed so as not to be positioned on at least the analog signal circuit section and the amplification circuit section each of which is particularly likely to be influenced by noises.

Herein, the air path 7 is detailed as follows. The air path 7 extends from the hollow section 9 to the outside of the solid-state imaging device 1 and prevents occurrence of condensation inside the covering section 4. A shape of the air path 7 is not particularly limited and can be arbitrarily set in accordance with a shape of the adhesive section 5.

In the solid-state imaging device 1 of the present embodiment, the air path 7 includes: a first opening end 7a extending to the hollow section 9; a second opening end 7b extending to the outside; and a catcher 7c which is provided between the first opening end 7a and the second opening end 7b so as to catch water. In this manner, the first opening end 7a of the air path 7 is provided on the adhesive section 5 so as to be positioned on the side of the hollow section 9, and the second opening end 7b of the air path 7 is provided on the adhesive section 5 so as to be positioned outside, and the catcher 7c for catching water existing in the air path 7 is provided between the first opening end 7a and the second opening end 7b which are provided on the air path 7. Thus, even if water or water and a foreign substance enter from the outside via the second opening end 7b in any production step carried out after a dicing step, the catcher 7c can catch (keep) the water and the foreign substance.

Further, in the solid-state imaging device 1, the second opening end 7b does not completely pierce the adhesive section 5. As a result, it is possible to more effectively prevent water and foreign substance from entering the hollow section 9 than a case where the second opening end 7b pierces the adhesive section 5.

Further, in the solid-state imaging device 1, each of the first opening end 7a and the second opening end 7b has a protruding wall 7d which protrudes toward the catcher 7c. Thus, the second opening end 7b extends so that the increment corresponds to the length of the protruding wall 7d. This structure hardly allows water to enter the hollow section 9 from the outside via the second opening end 7b in the dicing step. Further, even in case where water enters the catcher 7c, it is possible to prevent water caught by the catcher 7c from reaching the first opening end 7a along an internal wall of the catcher 7c, so that water hardly enters from the catcher 7c to the hollow section 9 via the first opening end 7a.

Further, in the solid-state imaging device 1, the adhesive section 5 has a cyclic-square shape in a plan view, and the air path 7 is formed along a side 5a of the adhesive section 5. If the adhesive section 5 has a cyclic-square shape in this manner, it is possible to easily design a layout of the adhesive section 5. Moreover, the air path 7 is formed along the side 5a of the adhesive section 5, so that a region in which the air path 7 is to be formed (or the catcher 7c) can be easily reserved. Further, if the air path 7 is formed along only the side 5a of the adhesive section 5, it is possible to make the solid-state imaging device 1 smaller.

Figure 3:
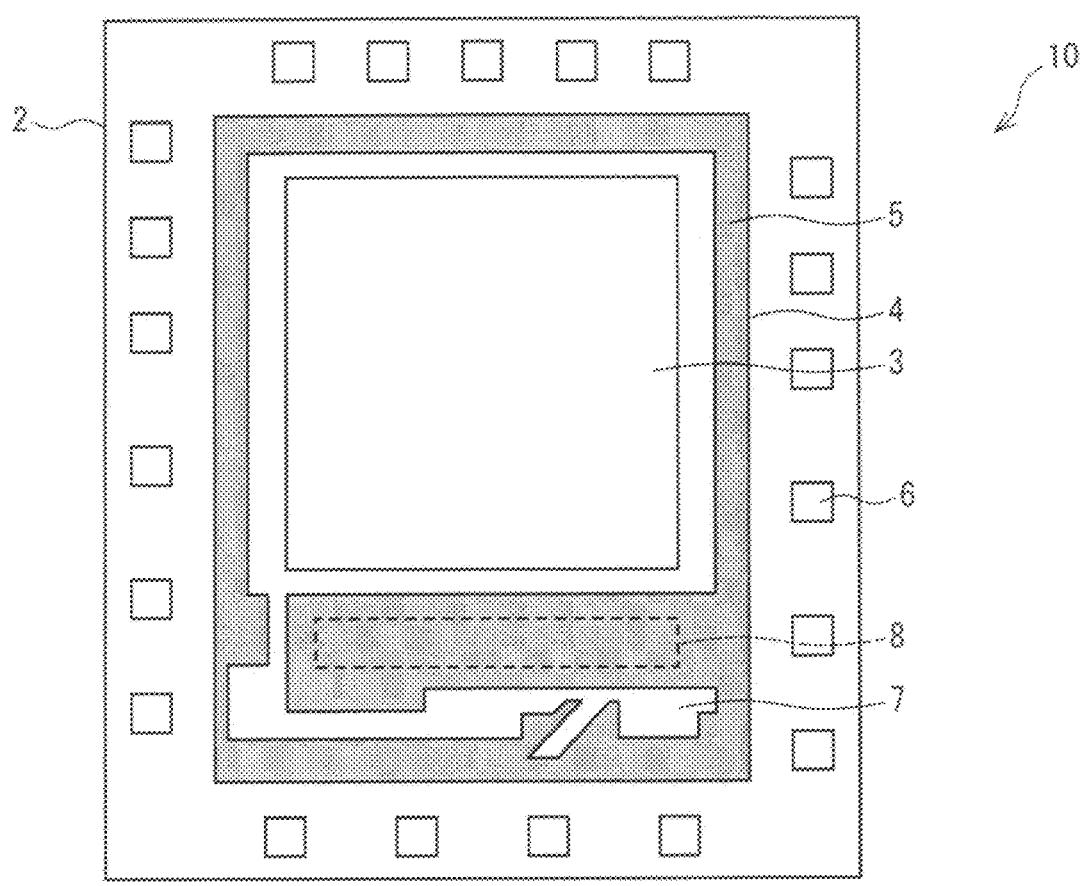
FIG. 3 is a plan view schematically illustrating another solid-state imaging device of the present invention.

Note that, in the solid-state imaging device 1 of FIG. 1, the adhesive section 5 is formed so as not to be positioned on the signal processing section 8. However, it may be so arranged that the adhesive section 5 entirely covers the signal processing section 8. FIG. 3 is a top view of a solid-state imaging device 10 in which the adhesive section 5 entirely covers the signal processing section 8. Also the solid-state imaging device 10 exhibits the same effect as the solid-state imaging device 1 of FIG. 1. That is, in the solid-state imaging device 1, (the entire face of) the signal processing section 8 is entirely covered by the adhesive section 5. As a result, the influence exerted by the adhesive section 5 to the signal processing section 8 is not partial. That is, the adhesive section 5 entirely influences the signal processing of the signal processing section 8. Thus, it is possible to reduce noises occurring in the signal processing section 8.

Further, the shape of the adhesive section 5 is not particularly limited as long as the adhesive section 5 is formed so as not to be positioned on the signal processing section 8 or the adhesive section 5 is formed so as to entirely cover the signal processing section 8 as illustrated in FIG. 3. For example, various shapes can be set with reference to Patent Document 2.

Figure 4:
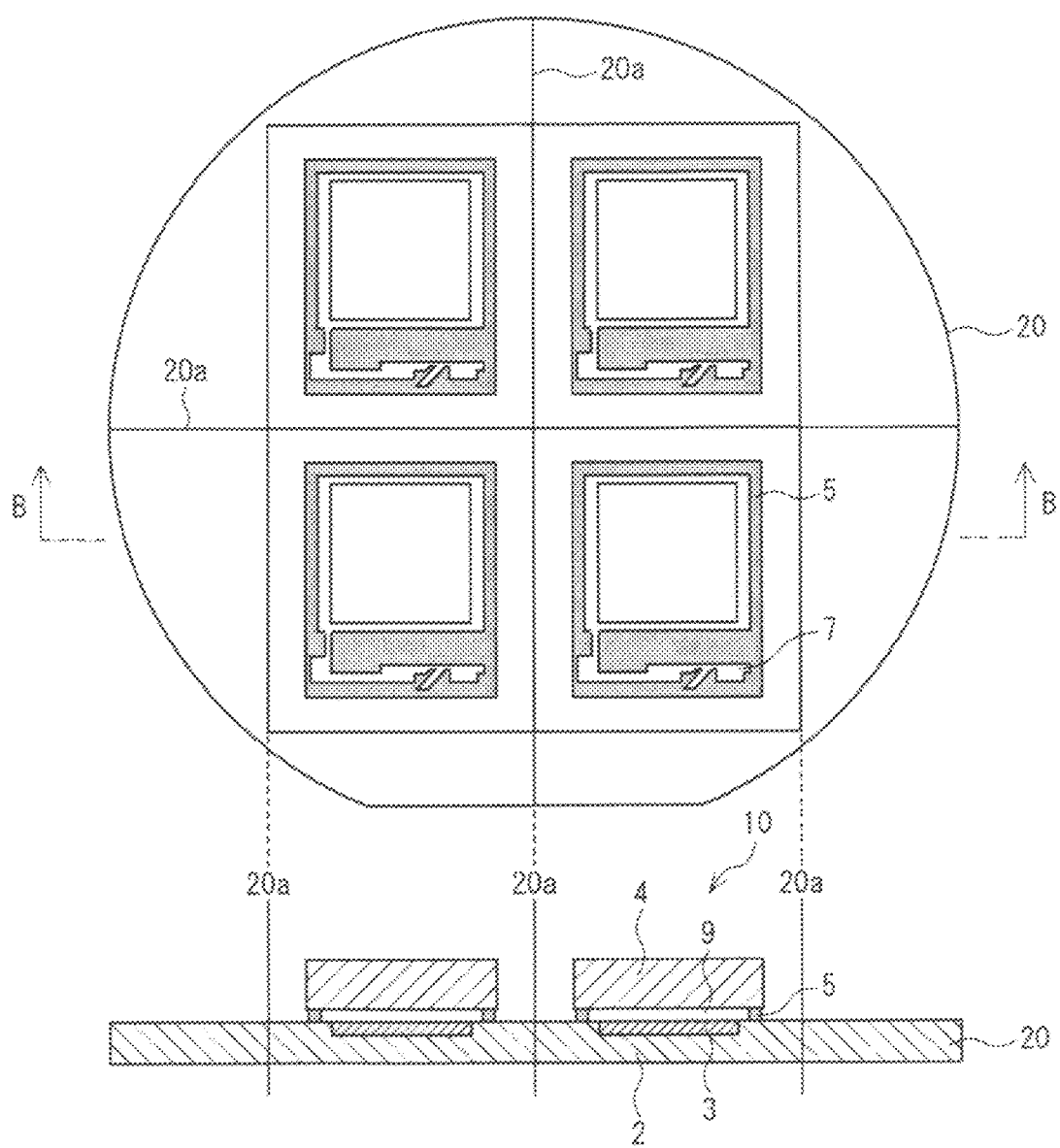
FIG. 4 is a plan view schematically illustrating a method for manufacturing the solid-state imaging device of FIG. 3.

The following describes an example of a method for manufacturing the solid-state imaging device 10. FIG. 4 illustrates a method for manufacturing a solid-state imaging device. The solid-state imaging device 10 can be manufactured as follows. A surface of the solid-state imaging element 2 is patterned in accordance with a known lithography technique so as to form the adhesive section 5, having a portion shaped as the air path 7, on each solid-state imaging element 2 of a semiconductor wafer 20, and the covering section 4 is bonded, thereby manufacturing the solid-state imaging device 10. The patterning allows a large number of adhesive sections 5 and a large number of air paths 7 to be formed on the respective solid-state imaging elements 2 of the semiconductor wafer 20 at the same time.

Specifically, an upper part of FIG. 4 illustrates a condition under which the covering section 4 having been formed on a suitable region around the effective pixel region 3 is bonded via the adhesive section 5 to the main face (plane having the effective pixel region 3) of each solid-state imaging element 2 formed on the semiconductor wafer 20. Each covering section 4 is suitably positioned in the region around the effective pixel region 3 at a single side of the solid-state imaging element 2, and then the covering section 4 is bonded by a suitable method such as irradiation of infrared ray or heat curing etc. in accordance with a property of adhesive used in the adhesive section 5.

A lower part of FIG. 4 is a cross sectional view taken along B-B of the upper part of FIG. 4. The adhesive section 5 is arranged so as to surround a periphery of the hollow section 9 formed between the effective pixel region 3 and the covering section 4, thereby preventing entrance/adhesion of dusts and scratch or the like in the effective pixel region 3 from deteriorating image quality. Further, by providing the air path 7 in the adhesion section 5, it is possible to exclude to the outside moisture having entered the hollow section 9 at the time of practical use or moisture having occurred in the hollow section 9 at the time of practical use. The bonding of the covering section 4 (formation of the adhesive section 5) is performed in a region other than the effective pixel region 3, so that the effective pixel region 3 is free from any physical stress.

The solid-state imaging element 2 to which the covering sections 4 have been bonded are suitably diced (divided) along a divisional line 20a and is separated from the semiconductor wafer 20 so as to form solid-state imaging devices 10. The solid-state imaging element 2 to which the covering section 4 has been bonded has the air path 7 which is provided in the adhesion section 5 used in the bonding so as to prevent water from entering the hollow section 9 from the outside at the time of the dicing step, so that it is possible to prevent water and foreign substance such as parings from adhering to the effective pixel region 3 as dusts, thereby preventing a surface of the effective pixel region 3 from being damaged.

Note that, the description of the solid-state imaging device 10 is an example, and the arrangement of the solid-state imaging device 10 is not limited to the description. For example, the solid-state imaging device 10 can be manufactured in the same manner as in the manufacturing method of Patent Document 2 except for the shape of the adhesive section 5.

Figure 5:
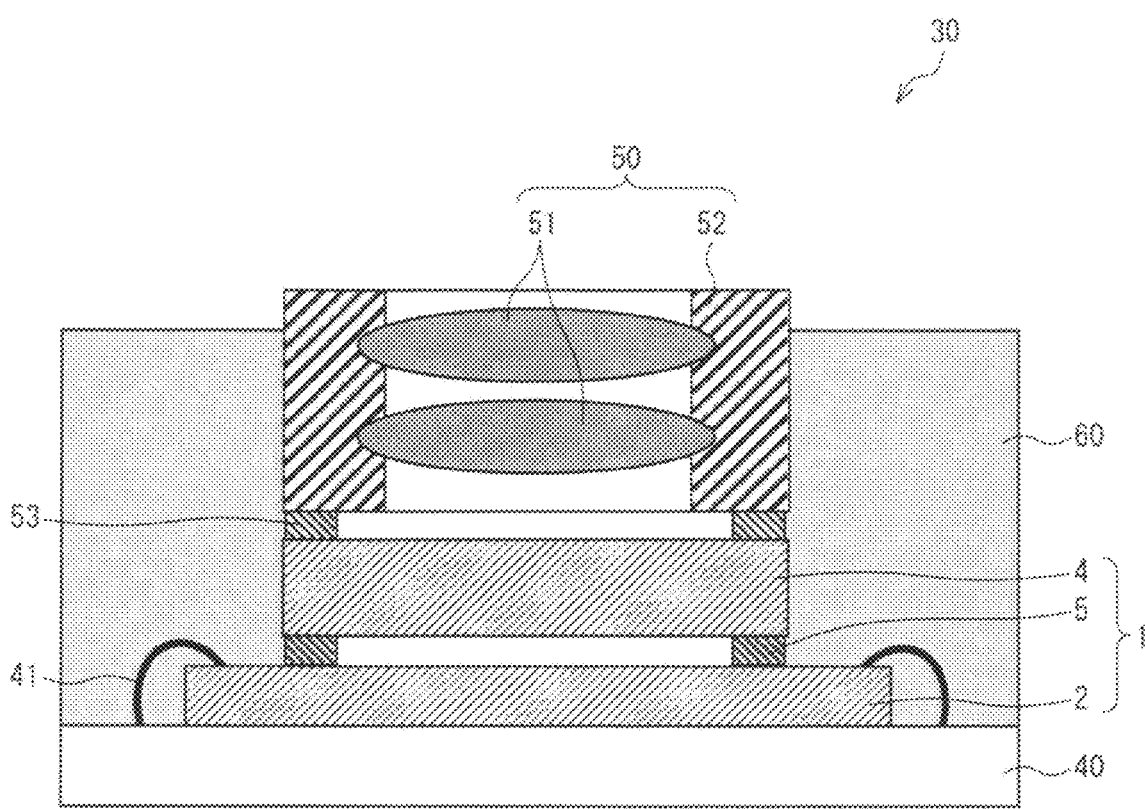
FIG. 5 is a cross sectional view schematically illustrating an arrangement of an optical device module of the present invention.
Figure 6:
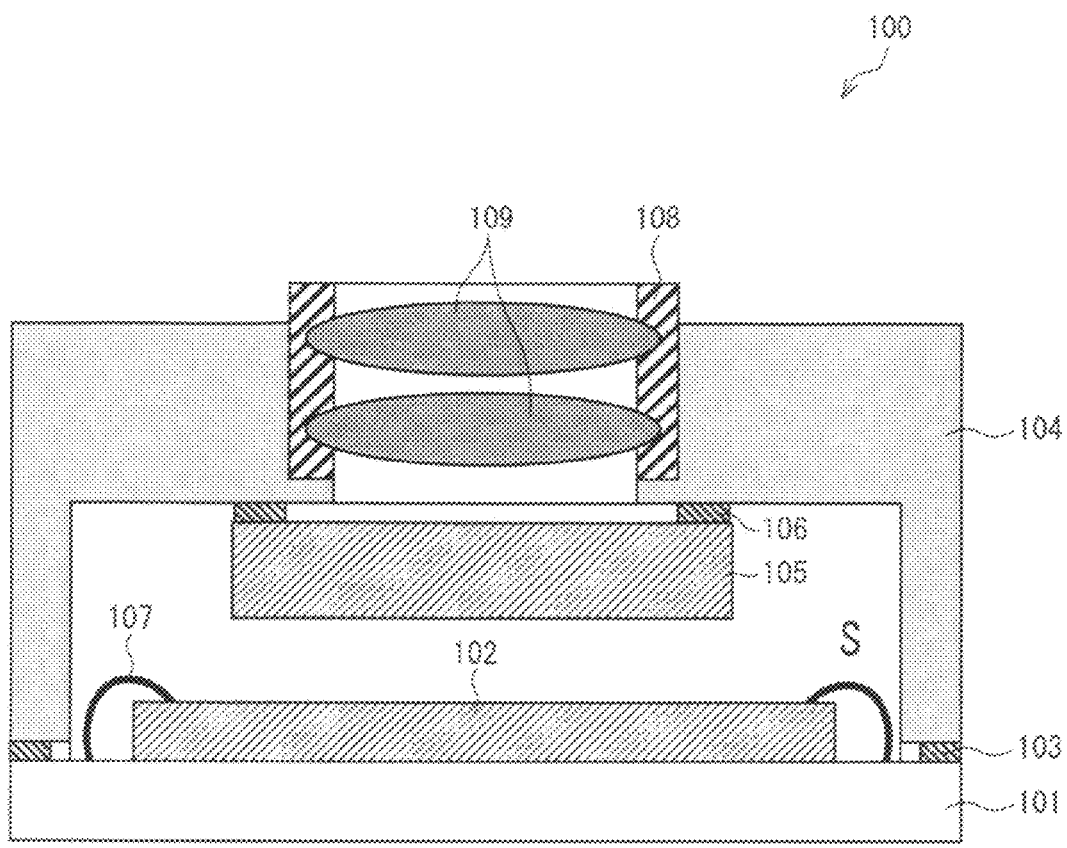
FIG. 6 is a cross sectional view schematically illustrating an arrangement of a conventional solid-state imaging device.
Figure 7:
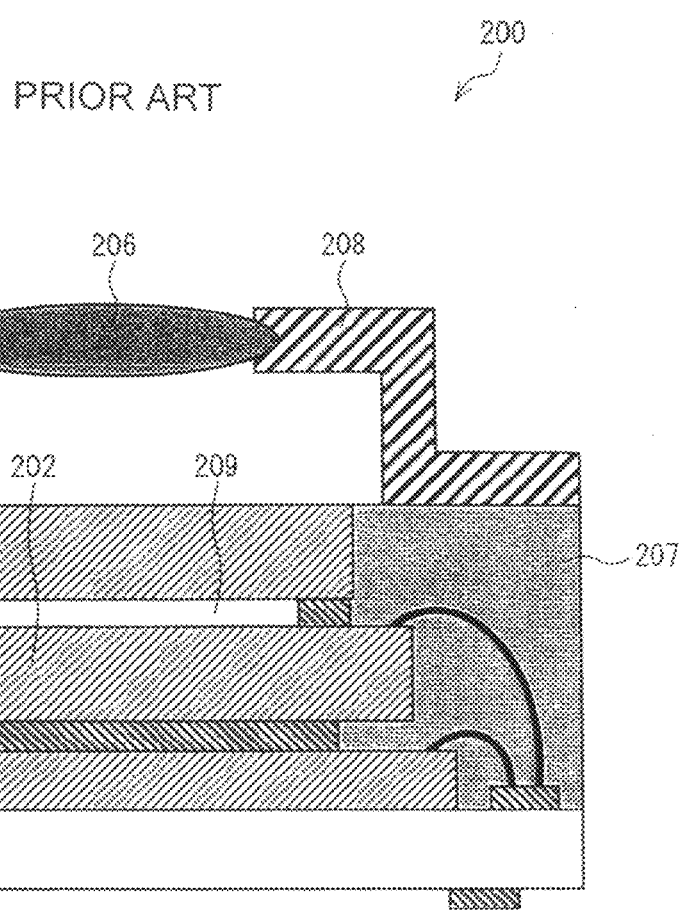
FIG. 7 is a cross sectional view of a solid-state imaging device of Patent Document 1.

The solid-state imaging device 1 of the present embodiment can be applied as an optical device module for example. FIG. 5 is a cross sectional view schematically illustrating an optical device module of the present invention. An example of an optical device module 30 is a camera module which is arranged so that the aforementioned solid-state imaging device 1 is provided on a wiring substrate 40 and a lens unit 50 is provided via an adhesive section 53 so as to be opposite to the covering section 4. Further, the solid-state imaging device 1 and the lens unit 50 are molded with a mold resin 60.

The wiring substrate 40 is constituted of a print substrate, a ceramic substrate, or the like. The lens unit 50 guides external light to the solid-state imaging element 2 and is equipped with a lens 51 and a lens holder 52 (referred to also as "housing", "optical path guide", or "lens barrel") for internally supporting the lens 51. Note that, a digital signal processor (referred to as "DSP": not shown) or the like is provided on the wiring substrate 40. Further, the solid-state imaging element 2 and the wiring substrate 40 are electrically connected to each other via a bonding wire 41.

In the optical device module 30, the solid-state imaging element 2 whose effective pixel region is protected by the covering section 4 is packaged. Thus, when manufacturing the optical device module 30, dusts do not adhere to the surface of the effective pixel region of the solid-state imaging element 2 in any step carried out after packaging the solid-state imaging element 2, so that it is possible to manufacture the optical device module 30 even under a less clean condition. Thus, it is possible to realize (i) an optical device module which can be manufactured with higher yields and simpler manufacturing steps and whose price can be made lower and (ii) a method for manufacturing the optical device module.

Note that, in the present embodiment, the solid-state imaging element is described as an example of the semiconductor element, and the solid-state imaging device is described as an example of the semiconductor device. However, instead of the solid-state imaging device, a semiconductor laser device which includes a semiconductor laser element as the semiconductor element and converts an electric signal into light may be applied as the semiconductor device. Further, a covering section made of non-transparent material may be used as the transparent covering section 4.

As described above, a semiconductor device of the present invention is arranged so that the adhesive section is formed so as to entirely cover the signal processing section or so as not to be positioned on the signal processing section. Thus, it is possible to reduce noises occurring in the signal processing section of the semiconductor element while preventing occurrence of condensation in the covering section for covering the semiconductor element.

It is preferable to arrange the semiconductor device of the present invention so that: the covering section is transparent, and the semiconductor element is a solid-state imaging element having an effective pixel region in which a plurality of photo acceptance elements for converting light transmitted through the covering section into an electric signal are disposed, and the adhesive section is formed so as not to be positioned on the effective pixel region.

According to the arrangement, the semiconductor element is a solid-state imaging element which handles an optical signal, e.g., a CCD image sensor or a CMOS image sensor. Thus, the semiconductor device of the present invention is applicable as a solid-state imaging device.

Moreover, according to the foregoing arrangement, the adhesive section is formed so as not to be positioned on the effective pixel region. That is, the adhesive section is formed on a region which does not shield an optical path between the covering section and the effective pixel region. Thus, it is possible to form the adhesive section and the air path without dropping a photo acceptance efficiency for an optical signal.

The semiconductor device of the present invention is particularly favorable in case where the signal processing section is an analog signal circuit section.

According to the arrangement, the adhesive section is formed so as to entirely cover the analog signal circuit section particularly susceptible to effect of noises or so as not to be positioned on the analog signal circuit section. Thus, it is possible to reduce noises of the analog signal circuit section in which noises are likely to occur.

The semiconductor device of the present invention is particularly favorable in case where the signal processing section is an amplification circuit section which amplifies the electric signal obtained by conversion with the photo acceptance elements.

In case where the semiconductor device of the present invention is a solid-state imaging device, the amplification circuit section is particularly susceptible to effect of noises. According to the arrangement, the adhesive section is formed so as to entirely cover the analog signal circuit section or so as not to be positioned on the analog signal circuit section. Thus, it is possible to reduce noises of the analog signal circuit section which is particularly susceptible to effect of noises in the solid-state imaging device. Note that, it is favorable that the amplification circuit section processes an analog signal which is particularly susceptible to effect of noises.

It is preferable to arrange the semiconductor device of the present invention so that the air path includes: a first opening end extending to the hollow section; a second opening end extending to the outside; and a catcher which is provided between the first opening end and the second opening end so as to catch water.

According to the, arrangement, the first opening end of the air path is provided on the side of the hollow section of the adhesive section and the second opening end of the air path is provided on the outside of the adhesive section, and the catcher for catching water from the air path is provided between the first opening end and the second opening end. Thus, even if water or water and foreign substance enter from the outside via the second opening end in any production step after the dicing step, the catcher can catch (keep) the water and foreign substance.

Note that, it is preferable that a shape of the catcher is larger than a shape of the first opening end. This makes it possible to prevent the water and foreign substance having been caught by the catcher from entering the hollow section via the first opening end. Thus, it is possible to prevent adhesion of the foreign substance and occurrence of scratch on a main face of the semiconductor element.

It is preferable to arrange the semiconductor device of the present invention so that the adhesive section has a cyclic-square shape, and the air path is formed along at least one side of the adhesive section.

According to the arrangement, the adhesive section has a cyclic-square shape in a plan view, so that a layout of the adhesive section can be easily designed. Moreover, the air path is formed along at least one side of the adhesive section, so that a region for forming the air path (or the catcher) can be easily reserved.

Note that, the air path can be formed so as to correspond to each of plural sides of the adhesive section or so as to cover the plural sides. However, in order to make the semiconductor device smaller, it is preferable to form the air path along only one side of the adhesive section.

The semiconductor device of the present invention can be favorably used as a solid-state imaging device installed on an optical device such as a camera, a video recorder camera, or the like, for example.

The present invention is not limited to the description of the embodiments above, but may be altered by a skilled person within the scope of the claims. An embodiment based on a proper combination of technical means disclosed in different embodiments is encompassed in the technical scope of the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device, comprising;
   a semiconductor element;
   a covering section for covering the semiconductor element;
   an adhesive section for bonding the semiconductor element and the covering section; and
   a signal processing section for processing a signal of the semiconductor element,
   wherein a hollow section is formed between the semiconductor element and the covering section, and
      an air path is formed in the adhesive section so as to extend from the hollow section to the outside, and
      the adhesive section is formed so as to entirely cover the signal processing section.

2. A semiconductor device comprising:
   a semiconductor element;
   a covering section for covering the semiconductor element;
   an adhesive section for bonding the semiconductor element and the covering section; and
   a signal processing section for processing an signal of the semiconductor element;
   wherein a hollow section is formed between the semiconductor element and the covering section, and
      an air path is formed in the adhesive section so as to extend from the hollow section to the outside, and
      the adhesive section is formed so as not to be positioned on the signal processing section, and the signal processing section is provided in the air path.

3. The semiconductor device as set forth in claim 1, wherein the covering section is transparent, and
   the semiconductor element is a solid-state imaging element having an effective pixel region in which a plurality of photo acceptance elements for converting light transmitted through the covering section into an electric signal are disposed, and
   the adhesive section is formed so as not to be positioned on the effective pixel region.

4. The semiconductor device as set forth in claim 2, wherein:
   the covering section is transparent, and
   the semiconductor element is a solid-state imaging element having an effective pixel region in which a plurality of photo acceptance elements for converting light transmitted through the covering section into an electric signal are disposed, and
   the adhesive section is formed so as not to be positioned on the effective pixel region.

5. The semiconductor device as set forth in claim 1, wherein the signal processing section is an analog signal section.

6. The semiconductor device as set forth in claim 2, wherein the signal processing section is an analog signal section.

7. The semiconductor device as set forth in claim 5, wherein the signal processing section is an amplification circuit section which amplifies the electric signal obtained by conversion with the photo acceptance elements.

8. The semiconductor device as set forth in claim 6, wherein the signal processing section is an amplification circuit section which amplifies the electric signal obtained by conversion with the photo acceptance elements.

9. The semiconductor device as set forth in claim 1, wherein the air path includes:
   a first opening end extending to the hollow section;
   a second opening end extending to the outside; and
   a catcher which is provided between the first opening end and the second opening end so as to catch water.

10. The semiconductor device as set forth in claim 2, wherein the air path includes:
    a first opening end extending to the hollow section;
    a second opening end extending to the outside; and
    a catcher which is provided between the first opening end and the second opening end so as to catch water.

11. The semiconductor device as set forth in claim 1, wherein
    the adhesive section has a cyclic-square shape, and,
    the air path is formed along at least one side of the adhesive section.

12. The semiconductor device as set forth in claim 2, wherein
    the adhesive section has a cyclic-square shape, and,
    the air path is formed along at least one side of the adhesive section.

13. An optical device module, comprising a semiconductor device and a lens unit, said semiconductor device comprising:
    a semiconductor element;
    a covering section for covering the semiconductor element;
    an adhesive section for bonding the semiconductor element and the covering section; and
    a signal processing section for processing a signal of the semiconductor element,
    wherein a hollow section is formed between the semiconductor element and the covering section, and
       an air path is formed in the adhesive section so as to extend from the hollow section to the outside, and
       the adhesive section is formed so as to entirely cover the signal processing section, and
       the covering section is transparent, and
       the semiconductor element is a solid-state imaging element having an effective pixel region in which a plurality of photo acceptance elements for converting light passing through the covering section into an electric signal are disposed, and
       the adhesive section is formed so as not to be positioned on the effective pixel region, and
       the lens unit guides external light to the semiconductor element.

14. An optical device module, comprising a semiconductor device and a lens unit, said semiconductor device comprising:
- a semiconductor element;
- a covering section for covering the semiconductor element;
- an adhesive section for bonding the semiconductor element and the covering section; and
- a signal processing section for processing a signal of the semiconductor element,
- wherein a hollow section is formed between the semiconductor element and the covering section, and
  - an air path is formed in the adhesive section so as to extend from the hollow section to the outside, and
  - the adhesive section is formed so as not to be positioned on the signal processing section, and the signal processing section is provided in the air path, and
- the covering section is transparent, and
- the semiconductor element is a solid-state imaging element having an effective pixel region in which a plurality of photo acceptance elements for converting light passing through the covering section into an electric signal are disposed, and
- the adhesive section is formed so as not to be positioned on the effective pixel region, and
- the lens unit guides external light to the semiconductor element.

\* \* \* \* \*